(12) United States Patent
Jarske

(10) Patent No.: US 6,578,119 B2
(45) Date of Patent: Jun. 10, 2003

(54) METHOD AND DEVICE FOR MEMORY MANAGEMENT IN DIGITAL DATA TRANSFER

(75) Inventor: Petri Jarske, Tampere (FI)

(73) Assignee: Nokia Corporation, Espoo (FI)

(*) Notice: Subject to any disclaimer, the term of this patent is extended or adjusted under 35 U.S.C. 154(b) by 95 days.

(21) Appl. No.: 09/809,122

(22) Filed: Mar. 15, 2001

(65) Prior Publication Data

US 2001/0023477 A1 Sep. 20, 2001

(30) Foreign Application Priority Data

Mar. 17, 2000 (FI) .............................................. 20000640

(51) Int. Cl.[7] .............................................. G06F 12/16
(52) U.S. Cl. ........................ 711/161; 711/165; 375/261; 375/262; 375/265
(58) Field of Search ................................ 711/161, 165; 375/261, 262, 265

(56) References Cited

U.S. PATENT DOCUMENTS 5,432,821 A 7/1995 Polydoros et al. .......... 375/340
5,930,298 A 7/1999 Choi ........................... 375/262

FOREIGN PATENT DOCUMENTS

EP 0967730 A1 12/1999
GB 2330994 A 5/1999

Primary Examiner—Hiep T. Nguyen
(74) Attorney, Agent, or Firm—Perman & Green, LLP

(57) ABSTRACT

A method and device for memory management in digital data transfer, in which the device consists of first memory rows (61) and second memory rows (62) and in the method, a bit column with fixed values is added as the first column (64) of the second memory rows, first bit rows are copied (63) as second bit rows in accordance with the Add-Compare-Select unit's selections, and the selection for the decoded bit is performed based on the values of elements in the column (66) formed by the second bit rows or based on some other row formed by the second bit columns.

29 Claims, 9 Drawing Sheets

Table 81

| Row | State | New bits | | | | | | | | | | | | old bits |
|---|---|---|---|---|---|---|---|---|---|---|---|---|---|---|
| 0 | 000 | 0 | 0 | 0 | 1 | 0 | 0 | 1 | 0 | 1 | 1 | 0 | 1 | 1 |
| 1 | 001 | 1 | 0 | 0 | 0 | 0 | 0 | 1 | 0 | 1 | 1 | 0 | 1 | 1 |
| 2 | 010 | 0 | 1 | 0 | 0 | 0 | 0 | 1 | 0 | 1 | 1 | 0 | 1 | 1 |
| 3 | 011 | 1 | 1 | 0 | 0 | 0 | 0 | 1 | 0 | 1 | 1 | 0 | 1 | 1 |
| 4 | 100 | 0 | 0 | 1 | 0 | 0 | 0 | 1 | 0 | 1 | 1 | 0 | 1 | 1 |
| 5 | 101 | 1 | 0 | 1 | 0 | 0 | 0 | 1 | 0 | 1 | 1 | 0 | 1 | 1 |
| 6 | 110 | 0 | 1 | 1 | 0 | 0 | 0 | 1 | 0 | 1 | 1 | 0 | 1 | 1 |
| 7 | 111 | 1 | 1 | 1 | 0 | 0 | 0 | 1 | 0 | 1 | 1 | 0 | 1 | 1 |

Table 82

| From row | To row | State shift | BM | PM | Select |
|---|---|---|---|---|---|
| 0 | 0 | 0000 | 2 | 3 | Y |
| 0 | 1 | 0001 | 0 | 1 | Y |
| 1 | 2 | 0010 | 1 | 4 | Y |
| 1 | 3 | 0011 | 1 | 4 | Y |
| 2 | 4 | 0100 | 1 | 5 | N |
| 2 | 5 | 0101 | 1 | 5 | N |
| 3 | 6 | 0110 | 0 | 4 | Y |
| 3 | 7 | 0111 | 2 | 6 | N |
| 4 | 0 | 1000 | 0 | 5 | N |
| 4 | 1 | 1001 | 2 | 7 | N |
| 5 | 2 | 1010 | 1 | 6 | N |
| 5 | 3 | 1011 | 1 | 6 | N |
| 6 | 4 | 1100 | 1 | 3 | Y |
| 6 | 5 | 1101 | 1 | 3 | Y |
| 7 | 6 | 1110 | 2 | 6 | N |
| 7 | 7 | 1111 | 0 | 4 | Y |

Table 83

| Row | State | K | New bits | | | | | | | | | | | old bits |
|---|---|---|---|---|---|---|---|---|---|---|---|---|---|---|
| 0 | 000 | 0 | 0 | 0 | 0 | 1 | 0 | 0 | 1 | 0 | 1 | 1 | 0 | 1 |
| 1 | 001 | 1 | 0 | 0 | 0 | 1 | 0 | 0 | 1 | 0 | 1 | 1 | 0 | 1 |
| 2 | 010 | 0 | 1 | 0 | 0 | 0 | 0 | 0 | 1 | 0 | 1 | 1 | 0 | 1 |
| 3 | 011 | 1 | 1 | 0 | 0 | 0 | 0 | 0 | 1 | 0 | 1 | 1 | 0 | 1 |
| 4 | 100 | 0 | 0 | 1 | 1 | 0 | 0 | 0 | 1 | 0 | 1 | 1 | 0 | 1 |
| 5 | 101 | 1 | 0 | 1 | 1 | 0 | 0 | 0 | 1 | 0 | 1 | 1 | 0 | 1 |
| 6 | 110 | 0 | 1 | 1 | 0 | 0 | 0 | 0 | 1 | 0 | 1 | 1 | 0 | 1 |
| 7 | 111 | 1 | 1 | 1 | 1 | 0 | 0 | 0 | 1 | 0 | 1 | 1 | 0 | 1 |

Fig. 8

METHOD AND DEVICE FOR MEMORY MANAGEMENT IN DIGITAL DATA TRANSFER

FIELD OF THE INVENTION

The present invention relates to a method and device for memory management in digital data transfer, and especially but not necessarily memory management in the decoding of the digital data of convolution codes.

BACKGROUND OF THE TECHNIQUE

In digital data transfer, it is primarily important to get the departing data to its destination as reliably and flawlessly as possible. One alternative for achieving this, especially in a noise limited? environment, has been to use a larger transmission power. However, regulations made for practical reasons limit the highest permissible transmission power. Another alternative has been to add a redundant information to the transmitted data, which the receiver uses to correct any errors.

In a digital mobile communications network, a received signal also contains noise and channel distortions that cause bit errors, which are then (partly) corrected using an error correction code. The transmitted bit stream can be protected against errors, e.g. as depicted in FIG. 1, with a corresponding encoder 10, which includes the modulo-2 summing units 11, 12 for forming the convolution code, the shift register 13–16 for receiving the bit to be coded, input feed for the bit to be coded 17 and the encoded bit's output bits 18, 19. The length (constraint length) of the encoder's shift register is K=4 and the rate is ½, so each bit to be coded 17 is presented as encoded by two output bits 18, 19. When a new bit is fed into the shift register 13–16 into an element 16, the bit of the element in question moves to element 15, the bit of element 15 moves to element 14 and the bit of element 14 moves to element 13. If in our example the first bit to be transferred to the shift register 16 were 1, the output bits 18, 19 would be 11. The criteria for the above are that the shift register 13–16 is empty (DDDD=0000) in the initial situation. A bit-stream encoded according to FIG. 1 is decoded on reception for example using a Viterbi algorithm. Other decoding means can also be used.

In digital data transfer, the bit string received must contain some sort of convolution code, i.e. a code containing memory, so that the Viterbi algorithm can be utilised on reception. The Viterbi algorithm performs probability decoding using the Trellis diagram to reduce the need for computation. FIG. 2 depicts the Trellis diagram 200 formed by the K=4 convolution code, in which the possible initial states 210–217 are depicted as status column 201 and the possible end states 220–227 are depicted as status column 202. The encoder's output bits 18, 19 are depicted as values of branches 230–245. The shift register's 13–16 elements mentioned in FIG. 1 form a status shift, in which the shift register's elements 13–15 are the initial status of the Trellis diagram and elements 14–16 are the end status of the Trellis diagram, which are reached from the said initial states by feeding a new bit into the encoder's 10 shift register 13–16. Two branches 230–245 leave from each state 210–217 at the time t=T to the states 220–227 at the time t=2T. The corresponding 2-bit number for each branch 230–245, i.e. each branch state 250–265, is compared to the bit pair 18, 19 encoded with the encoder 10 in FIG. 1. If, for example, the bits in the encoder's shift register 13–16 are 0010, which signifies a state shift from the initial state 001 to the end state 010 when the next bit to be encoded is 1, the shift register's 13–16 bits, i.e. the state shift, are now 0101 (from initial state 010 to end state 101), in which case the encoder transmits as the output bits 18 and 19, 10. The Trellis diagram states depicted in FIG. 2 are utilised in the decoding stage of the data. Several path states formed by branch states formed from individual successive state shifts are stored in the decoder's memory. Each bit pattern to be transmitted corresponding to the branch state is compared to received, possibly incorrect, bits. When receiving new bits, the number of state shifts grows, so the memory must be continuously updated by deleting such paths that are not needed for forming the final bit to be decoded.

In the decoding of convolution codes, a so-called Viterbi decoder depicted in FIG. 3 is used, which consists of a BMU (Branch Metric Unit) 31, ACSU (Add-Compare-Select Unit) 32 and SMU (Survivor Memory Unit) 33. On receiving a bit pair, the BMU 31 calculates the metrics, i.e. the measurement of how far the received bit pair is from each, in this case 16, branch state values 250–265 corresponding to the Trellis diagram state shifts. For instance the so-called Hamming distance, i.e. by how many bits the received bits deviate at the time in question from all possible branch metrics corresponding to state shifts, can be used as a measurement. The following example consists of two different states 211, 215 at the time t=T and correspondingly the states 222, 223 at the time t=2T. The state of the Trellis diagram at the time t=T is 001 and the received bit pair is 10, in which case the metrics of the state shift 0010 (from state 001 to state 010) is 0, because the received bit pair and the value 10 of the branch in question do not deviate from one another. Another possible state shift 0011 (from state 001 to state 011) with the same received bit pair 10 would give a metric of 2, because both bits of the received bit pair 10 are now different from the branch value 01. The branches 230–245 depicting state shifts in FIG. 2 always correspond to the possible routes of one received bit pair, of which others are more probable than others and the metric must be calculated for each said branch.

The ACSU 32 depicted in FIG. 3 consists functionally of the Add part, which calculates the cumulative path metric of all paths, i.e. the distance between all possible beginnings and ends of paths; the Compare part, which compares which branch ending in an end state is the more probable choice, i.e. closer to the received bit pair; and the Select part, which selects the more probable branch and stores it to memory. The less probable branch is disqualified and if the other branch that reaches the state in question is disqualified, the entire path leading to the state in question can also be deleted from memory as unnecessary. In the following example the less probable option is disqualified for the other branch as well. As in the previous example, here we will also look at the state shift 0010 from state 001 (211) to state 010 (222), and the state shift 1011 from state 101 (215) to state 011 (223). As seen in FIG. 2, states 001 and 101 both branch off to states 010 and 011. As was earlier stated, the received bit pair was 10. The branch value in question has two probable state shifts, i.e. state shift 0010 (from state 001 to state 010 and state shift 1011 (from state 101 to state 011). State 010 (t=2T) is reached from both state 001 (t=T) with the value 10 and from state 101 (t=T) with the value 01. If the selection made by the ACSU 32 targets path branch 232, which runs through states 010 (t=2T) and 001 (t=T), branches 233, 241 lead to state 011 (t=2T) and branches 240, 241 leaving from state 101 (t=T) are disqualified. All paths running through states 010 (t=2T), 101 (t=T) (branch 240), 011 (t=2T) and 101 (t=T) (branch 241) can now be deleted from the history data. State 101 (t=T) and all paths leading thereto can now be deleted from memory as unnecessary.

In FIG. 3, the SMU 33 stores the ACSU's selection data and defines the Trellis diagram final survivor path, which contains the possibly unencoded original bit sequence. An ACSU complying with the prior art is the so-called trace back memory 40 depicted in FIG. 4, the memory space of which consists of consecutive Trellis diagram states in the form of address books and functionally consists of the following parts. A write block 41, in which the decisions coming from the ACSU 32 are received for expressing the Trellis diagram state shifts, and a read region 42, 43, which is further divided into a merge block 42 and a decode block 43. All of the paths 44–47 formed by consecutive state shifts that lead to the one same path of decode block 43, i.e. survivor path 48, are traced over the merge block 42. Paths 44–47 are merged for that in which they are the same and the least probable branches are disqualified in accordance with the selections of the ACSU 32, until there is only one path travelling through the merge section, which is formed by several of the consecutive individual branches depicted in FIG. 2. Following this, the path in question is decoded, resulting in the original bit sequence. The operation of the trace back memory 40 is therefore based on reaching the final decoded bit sequence as content of the decode block 43, by going over all stored paths one by one from the merge block's new end to the old end (trace back) and merging the paths into one survivor path 48.

The tracing and merging of paths in the trace back memory is time-consuming, causing delays in the decoding process and therefore in reception and the entire data transfer. For the decoding process to be successful, the trace back memory has to be of a specific length. A common rule is that the length of the trace back memory's merge block has been set to the encoder's rate, i.e. the length of its shift register multiplied by 4 or 5. In the case of a convolution code formed with an encoder such as that depicted in FIG. 1, the shift register's length, i.e. its rate, is 4, so the length of the merge block should be at least 16–20 states or cycles long. The length of this memory defines both the performance of the decoder in correcting errors and the minimum delay with which the decoded bit, at the earliest, can be received from the memory.

The lengths of the trace back memory's blocks 41–43 can be altered without restriction and there can also be more than one read pointer. The more read pointers are used in memory space, the more paths can be merged at the same time. It is, however, difficult to make the method faster, even if the largest possible number of read pointers were used, because the merge block's trace back operation takes at least as many cycles as the number of consecutive state columns, i.e. the length of the block in question, is. If, for example, the trace back is performed one bit at a time and the updating of each bit takes one cycle, updating a code of 110 bits lasts 110 cycles.

SUMMARY OF THE INVENTION

With the present invention, the time consumed in memory processing in connection with data transfer can be minimised or at least reduced, especially but not necessarily during the reception process and decoding. In the reception process, the memory needs to be updated continuously, because more data is continuously being received. This leads to the fact that the memory has to be regularly updated by deleting old data from the memory. The speed of this memory update operation can be increased with the invention.

The present invention is based on the idea that the memory update is done without going over the paths step by step such as in using the trace back method, but instead by copying first memory rows into second memory rows in accordance with the selections of the ASCU, adding the bit column with fixed values as the second memory's first column and making the selection for the decoded bit based on the values of the second memory's last column. Which first memory row is copied to which second memory row is based on information provided by the ACSU. Several paths are not merged into one; instead for that part in which the paths are the same, they are shown in the memory several times on different rows. This method of copying between memories leads to the fact that rows at the oldest end of the memory are normally the same, so the original bit can be detected from the memory's last column. In a memory device corresponding to the invention, the paths formed by the state shifts are no longer seen as a bit sequence formed by consecutive states, but instead the last element of each row of the memory bank represents the original unencoded bit. Due to errors there may be differences in the oldest end of rows, so the final selection of the decoded bit can be made e.g. by a majority decision, by selecting the bit value that appears numerically the most in the last memory column.

The invention's goal is achieved with parallel memory updating, which takes place by using two memories side by side by copying a bit row from the first memory (or memory section) to a bit row in the second memory (or memory section). The rows in the first memory are old (not updated) and the rows formed in the second memory are new (updated). The new fixed bit column is added as the second memory's first column and the old rows of the first memory are copied after the second memory's first column, based on the BMU's information, so that the first memory's first column is the second memory's second column and the first memory's second last column is the second memory's last column. The second memory now contains the updated bit rows and the first memory's last column is copied e.g. as a column after the last actual column of the second memory. The original decoded bit is found from the column in question by selecting the value that numerically appears the most in the column. In the next round, the second memory's rows are old and the updated bit rows are copied to the first memory. The change of direction in the copying between memories is performed using simple logic and selection elements.

According to the first aspect of the invention, there is implemented a memory device for the storage of bit rows, characterised in that the memory device consists of a first memory matrix, which contains bit storage places in matrix form where the horizontally consecutive storage places form the first memory rows and the vertically consecutive storage places form the first memory columns; a second memory matrix, which contains bit storage places in matrix form where the horizontally consecutive storage places form the second memory rows and the vertically consecutive storage places form the second memory columns; an input for receiving selection data; addition means for adding fixed-value bits to the set first column as a default column for forming the bit values of the said second memory columns, in which each first column is a column among the said second memory columns; copying means for copying the contents of certain first memory rows row by row to the second memory rows while avoiding copying over the said default column, where the said received selection data affects the placement of the rows regarding which first memory row contents are copied to which second memory row, and for forming the bit values formed in the memory columns; and means for forming the initial bit value from the bit values of the defined second column, in which every second column is a column from the second memory columns.

According to a second aspect of the invention, there is implemented a method for memory management in the memory device, characterised in that the method consists of the following stages; selection data formed from the input bits is received; bits are copied from rows of the first memory matrix, which contains bit storage places in matrix form where the horizontally consecutive storage places form the first memory rows and the vertically consecutive storage places form the first memory columns, to rows of the second memory matrix, which contains bit storage places in matrix form where the horizontally consecutive storage places form the second memory rows and the vertically consecutive storage places form the second memory columns, in accordance with the said received selection data, fixed bit values are added to the second memory matrix to the defined first column for forming the default column from the said fixed bit values, in which each first column is a column among the said second memory columns; the contents of the said first memory rows are copied row by row to the said second memory rows while avoiding copying over the said default column in accordance with the said received selection data, while the said received selection data affects the rows' placement regarding which first memory row content is copied to which second memory row; a column is added to the second memory matrix for storing fixed bit values as the said column; the set fixed bit values are stored as a column in the second memory matrix, upon which the said storage of the fixed bit values is performed to the said added column from the said second memory columns while the said column forms the default column; the initial bit value is formed from the second column bit values, in which every second column is a column among the second memory columns.

According to a third aspect of the invention, there is implemented a Viterbi decoder for use in decoding convolution codes, which consists of a branch metric unit for receiving the input bit and calculating the metric data, an Add-Compare-Select unit for forming selection data and a survivor memory unit for storing bit sequences, characterised in that the said survivor memory consists of a first memory matrix, which contains bit storage places in matrix form where the horizontally consecutive storage places form the first memory rows and the vertically consecutive storage places form the first memory columns, a second memory matrix, which contains bit storage places in matrix form where the horizontally consecutive storage places form the second memory rows and the vertically consecutive storage places form the second memory columns, an input for receiving selection data from the ACSU, additional equipment for adding fixed-value bits to the set first column as a default column for forming the bit values of the said second memory columns, in which each first column is a column among the said second memory columns, copying means for copying the contents of certain first memory rows row by row to the second memory rows while avoiding copying over the said default column, where the said received selection data affects the placement of the rows regarding which first memory row contents are copied to which second memory row and for forming the bit values formed in the memory columns; and means for forming the initial bit value from the bit values of the set second column, in which every second column is a column from the second memory columns.

According to a fourth aspect of the invention, there is implemented an electronic device, consisting of equipment for receiving a bit sequence, equipment for forming selection data from the said bit sequence, and survivor memory for storing the bits, characterised in that the said survivor memory consists of a first memory matrix, which contains bit storage places in matrix form where the horizontally consecutive storage places form the first memory rows and the vertically consecutive storage places form the first memory columns, a second memory matrix, which contains bit storage places in matrix form where the horizontally consecutive storage places form the second memory rows and the vertically consecutive storage places form the second memory columns, an input for receiving selection data from the ACSU, additional means for adding fixed-value bits to the set first column as a default column for forming the bit values of the said second memory columns, in which each first column is a column among the said second memory columns, copying means for copying the contents of certain first memory rows row by row to the second memory rows while avoiding copying over the said default column, where the said received selection data affects the placement of the rows regarding which first memory row contents are copied to which second memory row and for forming the bit values formed in the memory columns; and means for forming the initial bit value from the bit values of the set second column, in which every second column is a column from the second memory columns. An electronic device is a mobile communications device or a computer.

BRIEF DESCRIPTION OF THE DRAWINGS

In the following, the invention will be explained in detail by referring to the enclosed drawings, in which:

FIG. 8 illustrates the contents of the memory's memory matrices according to the invention.

DETAILED DESCRIPTION

The prior art was explained above with reference to FIGS. 1–4. The invention is explained below primarily with reference to FIGS. 5–9.

Figure 5:
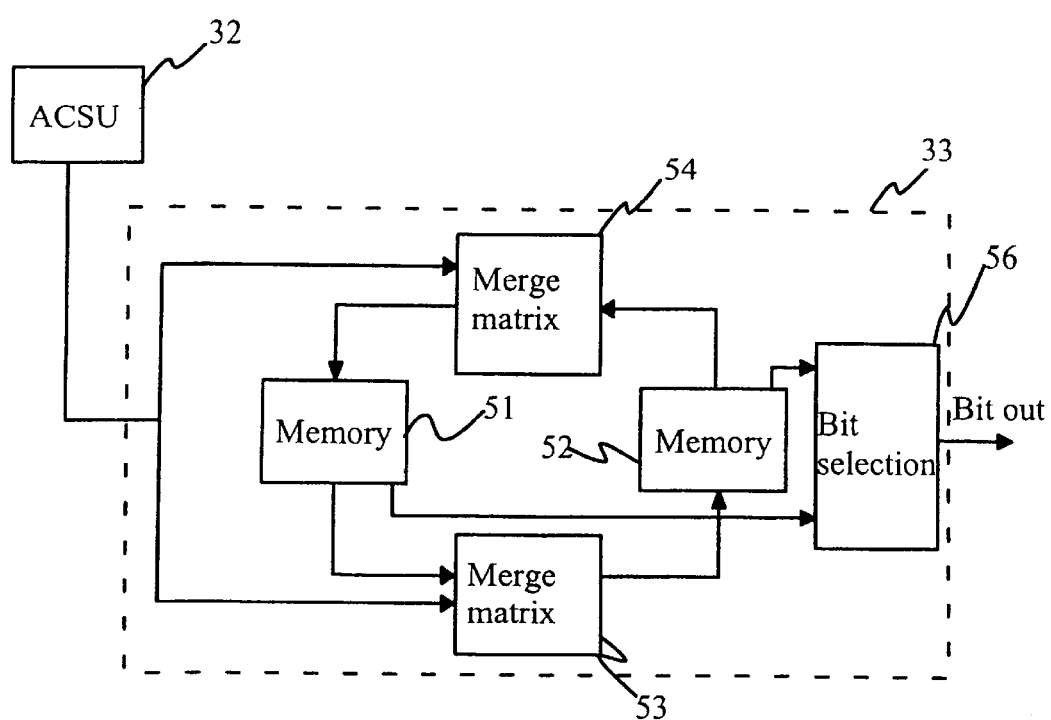
FIG. 5 illustrates a sectional diagram of a survivor memory according to the invention, which can be applied to the Viterbi decoder depicted in FIG. 3.

FIG. 5 illustrates a survivor memory 33 corresponding to one performance form of the invention, which consists of two memories 51, 52, two merge matrices 53, 54 and a selection element 56. The memories 51 and 52 consist of elements that are one-bit registers and the elements are depicted as memory rows and columns in matrix form. The merge matrix 53 is between memories 51 and 52, the merge matrix 54 is between memory matrix 52 and memory matrix 51. The merge matrices consist of selection elements that are depicted as selection rows and columns in matrix form. Merge matrices 53 and 54 are connected to the ACSU 32, from which merge matrices 53 and 54 receive the selection data based on which the merge matrices decide on the copying of rows between the said memory matrices. The change of direction can be performed e.g. by using an arrangement such as that depicted in FIG. 5, where the cycle between the memories takes place via the merge matrices. Memories 51 and 52 are connected to the transmitter element 56 for selecting the decoded bit after updating from the column after the last column in memory matrices 51 and 52, and for extracting the said bit element from the memory device.

Figure 6A:
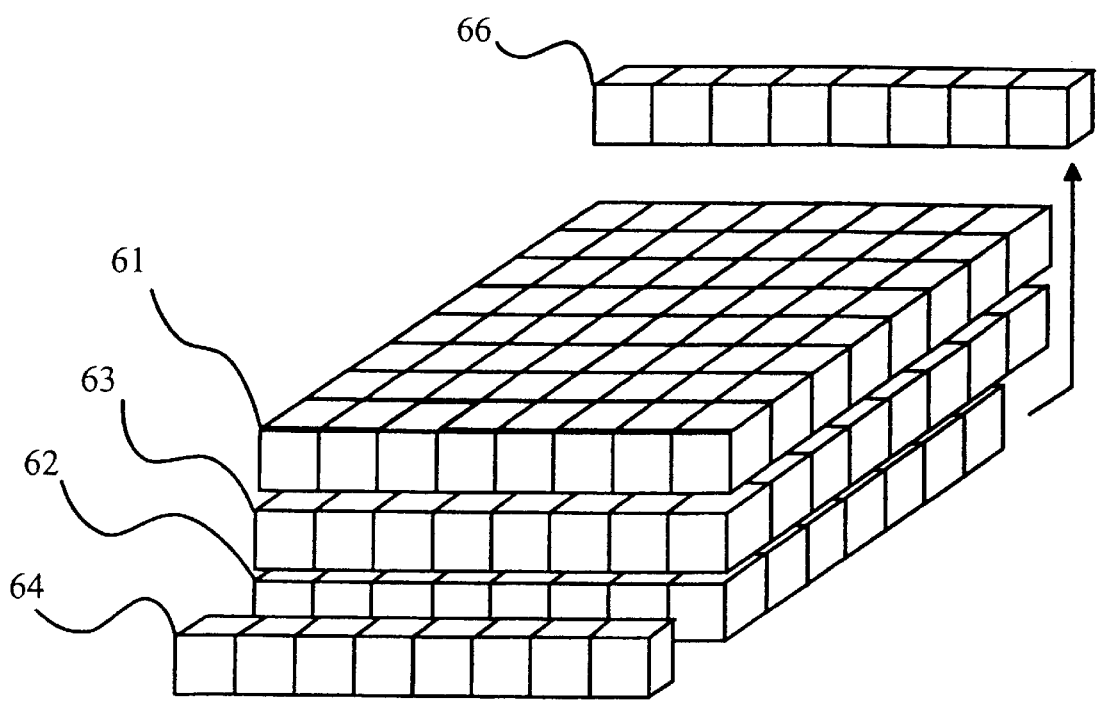
FIG. 6a illustrates the memory copying stage between memory matrices according to the invention.

FIG. 6a illustrates the copying stage between the memory matrices of the memory according to the invention. The copying stage from the memory matrix 51 depicted in FIG. 5 through merge matrix 53 to memory matrix 52 is identical to the copying taking place from memory matrix 52 through merge matrix 54 to memory matrix 51, so the following describes only the copying stage from memory 51 to memory 52. Memory 51 is depicted before updating as matrix 61, memory 52 after updating is depicted as matrix 62. The memories' number of rows is the same as the number of states in the state columns 201, 202 of the Trellis diagram depicted in FIG. 2, i.e. in this case there are 8 rows. The number of memory columns can be, for example, the length of the shift register of an encoder corresponding to that depicted in FIG. 1 multiplied by 4 or 5, but memories with more or less columns than the number in question can also be used. The merge matrix 63 is between memory matrices 61 and 62, corresponding to merge matrix 53. The first column of memory 62 is the fixed bit column 64. The value of the column's elements is determined based on the last bit of the corresponding Trellis diagram state. When copying from memory matrix 61 to memory matrix 62 via merge matrix 63, the first column of memory matrix 61 is copied as the second column of memory matrix 62. The second column as the third etc., the last column of memory matrix 61 is therefore copied as the column 66 after the last column of memory matrix 62 to the selection element 56, where the final selection of the decoded bit is made.

Figure 6B:
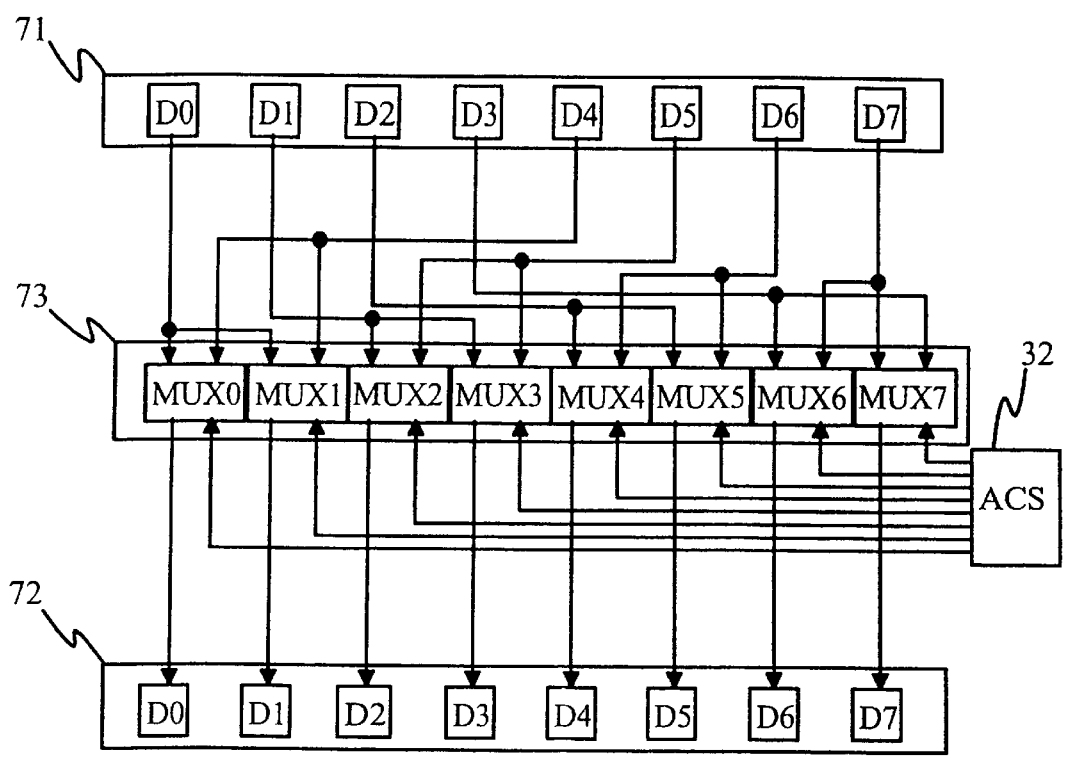
FIG. 6b illustrates the operation of a memory merge matrix according to the invention.

FIG. 6b illustrates the operation of the merge matrix corresponding to the invention in the form of a single column. Column N (reference 71) is copied from matrix 61 based on the selections of selection column N (reference 73) of selection matrix 63 as column N+1 (reference 72) of matrix 62. The elements of columns 71 and 72 as well as those of the entire memory matrix are efficiently implemented as one-bit registers, e.g. as D flip-flops. The copying of the elements of column 71 as elements of column 72 takes place in accordance with the from-row, to-row and state formula column of table 82. Each element in column 71 can be copied to two possible places in column 72. For instance, element D0 in column 71 can be copied to column 72 either as element D0 or D1. The selection of the elements to be copied is performed in accordance with the selection data of ACSU 32 in the multiplexes (MUX0-MUX7) of selection column 73.

Figure 7:
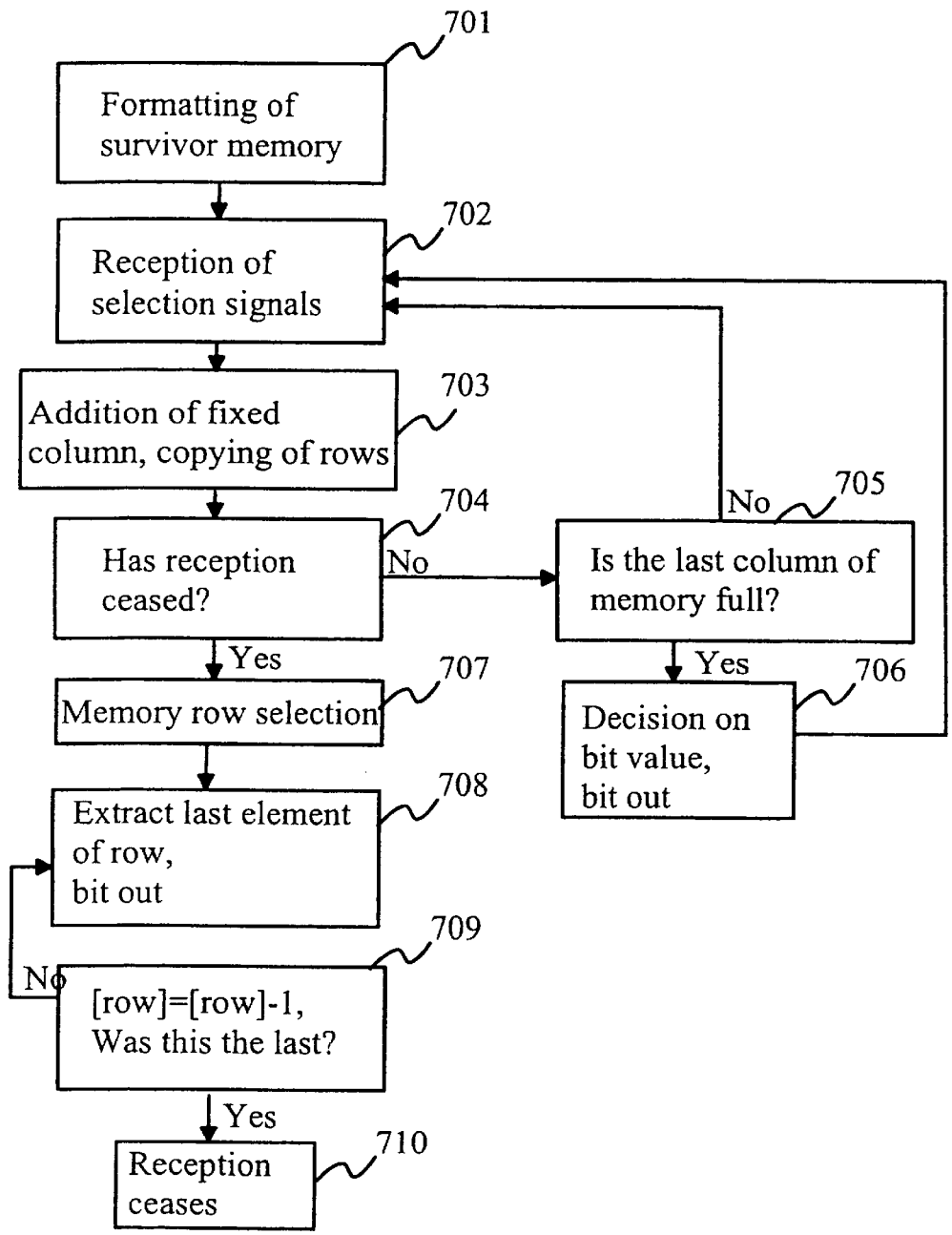
FIG. 7 illustrates a flow chart of the memory's operation according to the invention.

FIG. 7 illustrates a flow chart of the memory's operational principle. Old memory refers to memory 61 of FIG. 6 and update memory refers to memory 62 of FIG. 6. The first stage is the formatting of the survivor memory (step 701). When starting the reception of the bits, memories 51, 52 corresponding to those depicted in FIG. 5 have to be formatted e.g. by setting the values of all elements to zero. Then comes the reception of selection signals (step 702), in which the merge matrix receives the selection signals necessary for copying the memory rows from the ACSU 32. Then the rows of the old memory are copied to the memory that is to be updated and the fixed column is added as the first column of the update memory (step 703). If reception of the selection signals has ceased (step 702), it is then checked whether or not the update memory's last column 66 has been filled. If the column in question 66 is empty, stage 702 is repeated until reception ceases (step 704) or the memory is full (step 705). When the length of the memory row is e.g. 20 bit, a corresponding number of cycles is needed before the memory's last column is filled. When the column is full (step 705), a majority decision on the final value of the decoded bit is made (step 706) by selecting the value (0 or 1) that appears numerically the most in the column, and sending the value of the bit in question out of the memory. If the majority decision cannot be made, the selection can be made by always selecting one of the values or by randomly selecting one of the values. After selection, the process moves to stage 702. If reception of the selection signals has ceased (step 704), the process moves to the first memory row of the updated memory. After the encoding of the last bit in the encoder, the encoder's shift register has to be emptied of remaining bits as a signal of ending transmission. This is achieved by feeding as many zero bits as the length of the shift register in question after the last bit. The zero bits are shown on the memory's first row so that as many of the first elements of the row in question are zeroes as is the length of the encoder's shift register used. This row provides the information on which are the last received bits. From row selection (step 707), the process moves to extracting bits from the memory row in question (step 708), the row's last element is extracted by sending the value of the bit in question out of the memory and then the process moves to stage 709. It is now checked whether or not the element last extracted is the last in the row. If this is not so, the process returns to stage 708 until the last element has been extracted from the memory. The process then moves to stage 710 and the reception of transmission is terminated.

Figure 1:
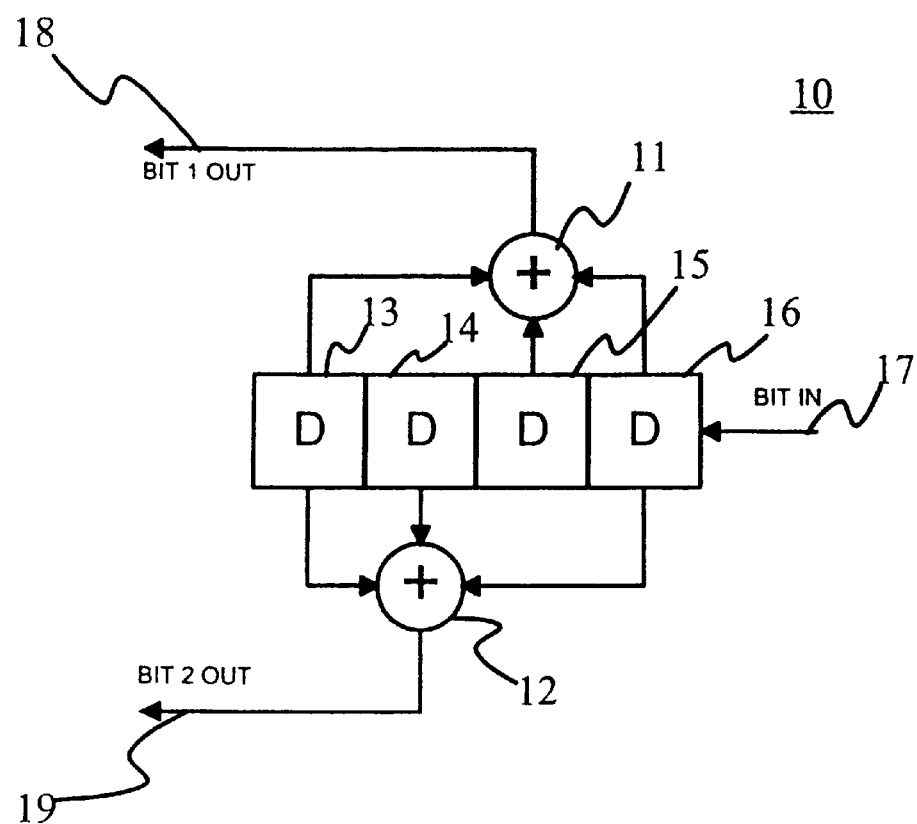
FIG. 1 illustrates a convolution encoder according to prior art.
Figure 2:
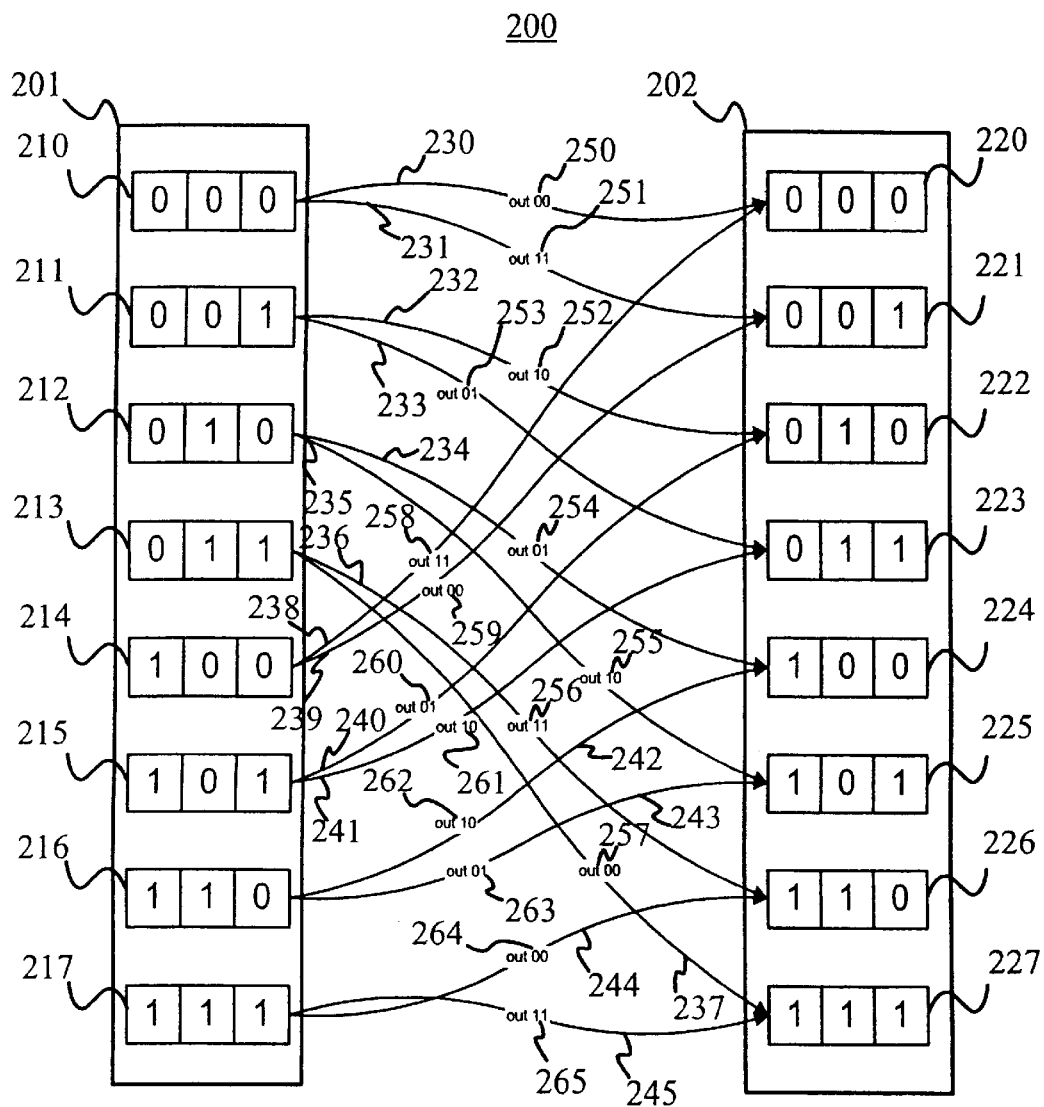
FIG. 2 illustrates the Trellis diagram.
Figure 3:
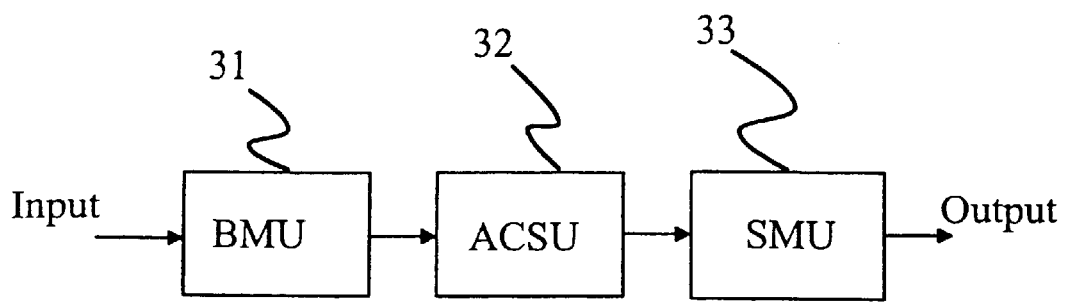
FIG. 3 illustrates the functional sections of the Viterbi decoder.
Figure 4:
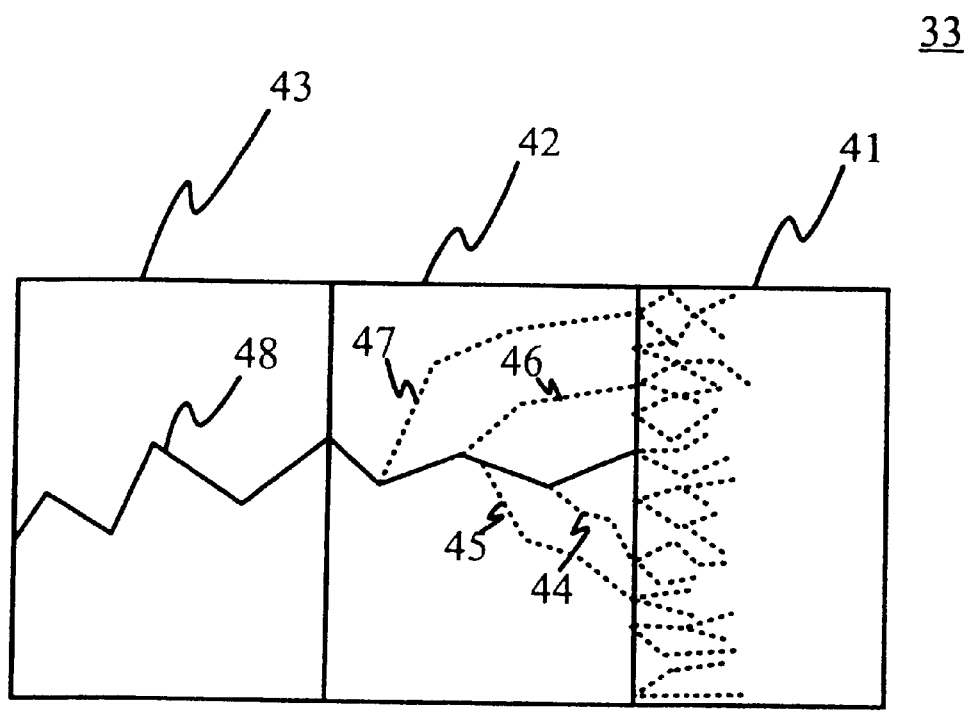
FIG. 4 illustrates a description of a trace back method according to prior art.

FIG. 8 illustrates the old memory 61 corresponding to FIG. 6 and the new updated memory 62 for the first 13 columns. Table 81 depicts the memory's content at the present moment before receiving a new bit pair and table 82 depicts the memory's content after the update brought on by the received bit pair. Table 81 consists of as many bit rows as the number of Trellis diagram states in the corresponding decoder—in this case 8 rows for each state 000, . . . , 111. To outline the copying of rows, table 82 presents a from-row column and a to-row column, which better illustrate the state shift column that depicts all Trellis diagram state shifts 0000, . . . , 1111. The state shifts in question depict the Trellis diagram branches 230–245, corresponding to FIG. 2, from the state at the time t=T (table 81) to the state at the time t=2T (table 83). The branch metric of each state shift is illustrated as a column BM, the value of this metric illustrates the measurement by which the received bit pair deviates from the bit pair 250–265 of each state shift corresponding to FIG. 2. The cumulative metric column PM illustrates the overall metric for each state shift, to which all previous branch metric values for that state shift have been summed up. The Trellis diagram in FIG. 2 depicts all possible state shifts between two consecutive periods of time. Column BM therefore shows the metric of the last two consecutive periods of time and column PM shows the metric accumulation from the initial moment to the state shift in question. The selection column Select illustrates, with the letters Y and N, the selections performed regarding each state shift based on the column PM. As becomes apparent from FIG. 2, each new state at the time t=2T is joined by two branches from different states at the time t=T. The following looks at the copying of rows from FIG. 8 in greater detail. As can be seen from the to-row column of table 82, each row can be copied from table 81 to two possible rows in table 83. The selection, based on which the letter is determined in column 86, is acquired from column PM. For example, the cumulative metric for state shift 0000 (from table 81 row 0 to table 83 row 0) is 3 and for state shift 1000 (from table 81 row 4 to table 83 row 0) it is 5. That bit is always selected from the pair, which has a smaller cumulative metric (PM column), and the selected is copied (Select column) from the old memory (table 81) to the new memory (table 83). In the previous example, state shift 0000 was selected, because its metric was 3 (state shift 1000's metric was 5), so now the row 0 indicated by table 82 that implements state shift 0000 is copied from the old memory (table 81) to row 0 of the new memory (table 83). It can be seen from the Trellis diagram and also from the first three bits of the state shift in question that state 100 is in question. All other selected rows are also copied to the new memory in a similar manner, however, so that copying to the fixed bit column K is avoided. The bit values of column K are determined based on the last three bits of the state shifts of table 82's state shift column.

A method and device according to a performance form of the invention are depicted below with reference to FIGS. 2, 3, 5, 6a, 6b and 7. The survivor memory is formatted (step 701). The BMU 31 receives (step 702) the bit pair and compares it to all possible bit pairs corresponding to the state shifts of the Trellis diagram corresponding to FIG. 2. The ACSU 32 calculates the cumulative metric for all Trellis diagram state shifts 230–245 based on the BMU's data. All possible state shifts (0000, . . . , 1111) are reviewed, and based on the metric thereof the process selects the row that will be copied in the survivor memory 33 from memory matrix 61 to memory matrix 62. The merge matrix 53 receives the selection data from the ACSU 32 and based on the received data copies the rows of memory matrix 51 to memory matrix 52, adding the fixed (step 307) bit column 64 as the first column in memory 52. It is then checked, whether or not reception has ceased (step 704), and if not, the process moves to step 705 to check if the memory's last column is full. If not, steps 702–705 are repeated until the process moves on to step 706, where the decision is made concerning the bit to be selected either by majority decision or, if a majority decision cannot be made, by selecting 0 or 1 either randomly or purposefully, after which the process moves on to step 702. If it is found in step 704 that reception has ceased, the process moves to step 707 and the first row, row 0, of the updated memory matrix 62 is selected. Its first four elements are zeroes, due to the fact that the contents of the encoder that produced the convolution code have been emptied by feeding the said four zeroes as the last bits. In step 708, the row's last bit is extracted and the process moves on to step 709 to check if the said last bit was the row's last element. If the last element has been extracted from the row, the process moves on to step 710, otherwise steps 708 and 709 are repeated until step 710 is reached, upon which the reception of transmission ceases and the device's operation ceases.

When comparing a survivor memory device according to the invention of a device according to prior art, the following advantages in favour of the device according to the invention can be found. For decoding to be reliably successful even when there is an abundance of errors in the code, the length of the memory in both the device according to the invention and of that according to prior art must at least be the length of the previously mentioned encoder's shift register multiplied by 4 or 5. Updating of the memory during the decoding process in a solution according to prior art takes place sequentially (such as from state column 202 to state column 201 in FIG. 2), which in this case takes 16–20 cycles. In a solution corresponding to the invention, this can be performed fully parallel to the entire memory during one clock cycle, because the merging of paths during decoding, i.e. the merge operation, of the solution according to prior art is left out. The merging is only performed in the last column as the final decision as to the bit value. By using two parallel memories, the updating of the entire memory and the decoding of one bit can be performed during one clock cycle. Therefore the example presented performs the decoding 16 20 times faster compared to prior art. In continuous decoding, the decoding delay depending on the length of the memory still exists even in the solution according to the invention, i.e. the memory's column 66 must be filled before the first decoded bit can be extracted from the memory. A further advantage of the device according to the invention compared to that according to prior art is that when the last bit has been received, the selected row can be extracted, if the bus width so permits, even in one clock cycle.

The memory device described above has been implemented on a convolution code with an encoder's shift register length (constraint length) of K=4 and at the rate of ½, i.e. each bit to be encoded is depicted by two output bits when encoded. A person skilled in the art will appreciate that the said memory device can also be used for decoding a convolution code produced by such encoders with a shift register or rate deviating from the values stated above.

The implementation and the embodiments of the invention have been illustrated herewith by means of examples. A person skilled in the art will appreciate that the present invention is not restricted to details of the embodiments presented above and that the invention can also be implemented in another form without deviating from the characteristics of the invention. The presented embodiments should be regarded as illustrative but not restricting. Thus, the possibilities of implementing and using the invention are only restricted by the enclosed claims. Therefore the different options of implementing the invention as determined by the claims, including the equivalent implementations, are within the scope of the invention.

What is claimed is:

1. A memory device for storing bit rows, wherein the memory device comprises a first memory matrix, which contains bit storage places in matrix form where the horizontally consecutive storage places form the first memory rows and the vertically consecutive storage places form the first memory columns, a second memory matrix, which contains bit storage places in matrix form where the horizontally consecutive storage places form the second memory rows and the vertically consecutive storage places form the second memory columns, an input for receiving selection data, adding means for adding fixed-value bits to a column as a default and first column for forming the bit values of the second memory columns, in which each first column is a column among the second memory columns, copying means for copying the contents of certain first memory rows row by row to the second memory rows whilst avoiding copying over the said default column, where the received selection data affects the placement of the rows regarding which first memory row contents are copied to the second memory row, and forming means for forming the initial bit value from the bit values of a definite second column, which second column is a column from the second memory columns.

2. A memory device according to claim 1, wherein the first and second memory matrices are part of the same memory.

3. A memory device according to claim 1, wherein the first and second memory matrices are physically in separate memories.

4. A memory device according to claim 1, wherein the selection data for copying bit rows is received from the Add-Compare-Select unit (ACSU).

5. A memory device according to claim 1, wherein there are as many first memory rows as there are first states corresponding to a Trellis diagram and as many second memory rows as there are second states corresponding to the set Trellis diagram.

6. A memory device according to claim 1, wherein the first memory rows are implemented to correspond to each initial state corresponding to the Trellis diagram.

7. A memory device according to claim 1, wherein the second memory rows are implemented to correspond to each end state corresponding to the Trellis diagram.

8. A memory device according to claim 1, wherein the bits of the fixed value bit column are implemented to correspond to the last bit value of the end state of the Trellis diagram.

9. A memory device according to claim 1, wherein the copying means in turn consists of selection means for selecting the memory rows to be copied in accordance with the received selection data.

10. A memory device according to claim 9, wherein the selection means is implemented so that from more than one memory row of the first memory rows one memory row is selected, the contents of which are copied to one memory row of the second memory rows.

11. A memory device according to claim 1, wherein the memory device is set to repeat the copying in cycles, whereupon the copying means for the copying of the contents of certain first memory rows row by row to second memory rows is set to copy from the first memory matrix to the second memory matrix in the first cycle, and is set to copy from the previous cycle's second memory matrix to the previous cycle's first memory matrix on all cycles following the first cycle.

12. A memory device according to claim 1, wherein the copying means for copying of the contents of certain first memory rows row by row to second memory rows has been set to copy the contents of a specific memory row in the first memory matrix as the contents of a specific memory row in the second memory matrix in accordance with the state shift of the corresponding Trellis diagram.

13. A method for memory management in the memory device, wherein the method comprises the following steps;
    receiving selection data,
    processing bits with the help of the first memory matrix, which contains bit storage places in matrix form where the horizontally consecutive storage places form the first memory rows and the vertically consecutive storage places form the first memory columns, and the second memory matrix, which contains bit storage places in matrix form where the horizontally consecutive storage places form the second memory rows and the vertically consecutive storage places form the second memory columns, adding fixed bit values to the second memory matrix to a column as a default and first column from the fixed bit values, in which each first column is a column among the second memory columns, copying the contents of the first memory rows row by row to the second memory rows while avoiding copying over the default column in accordance with the received selection data, while the received selection data affects the rows' placement regarding which first memory row content is copied to the second memory row, forming the initial bit value from the second column bit values, which second column is a column among the second memory columns.

14. A method according to claim 13, wherein the copying of memory rows is implemented so that the memory row to be copied is selected from more than one first memory row.

15. A method according to claim 14, wherein the selection is performed for each second memory row.

16. A method according to claim 13, wherein the selection data contains information on which first memory row is copied as a second memory row.

17. A method according to claim 13, wherein the N storage place's bit of the first memory rows is copied to the second memory rows' storage place N+1, in which N is the index number of the storage place.

18. A method according to claim 13, wherein the said addition of the fixed bit column is implemented so that the bits of the fixed bit column are added as bits of the second memory rows.

19. A method according to claim 18, wherein the said bits form the first bits of the second memory rows.

20. A method according to claim 13, wherein the copying is performed in cycles, in which
    in the first cycle, the memory rows of the first memory matrix are copied as memory rows of the second memory matrix, the fixed value bit column is added to the second memory matrix as the first column of the second memory matrix, and the value of the initial bit is formed from the bit values of the definite second memory matrix column, and in every cycle following the first, the previous cycle's second memory matrix is always selected as the first memory matrix and the previous cycle's first memory matrix is always selected as the second memory matrix, the memory rows of the first memory matrix are copied as memory rows of the second memory matrix, the fixed value bit column is added to the second memory matrix as the first column of the second memory matrix, and the value of the initial bit is formed from the bit values of the set second memory matrix column.

21. A method according to claim 13, wherein if the reception of selection data continues, the value of the initial bit is selected as a decision from a bit column formed by the second memory rows.

22. A method according to claim 21, wherein the bit column is a bit column formed by the last elements of the second memory rows.

23. A method according to claim 22, wherein the value of the initial bit is selected from the bit column's bit values by majority decision, in which case the value of the initial bit is determined by the value that appears numerically the most in the column.

24. A method according to claim 13, wherein when the reception of selection data ceases, the value of the initial bit is selected as a decision from a memory row formed by the second memory rows.

25. A method according to claim 24, wherein the memory row is the row implemented to correspond to the first state corresponding to that of the Trellis diagram.

26. A Viterbi decoder to be used in decoding convolution codes, comprising:
- a branch metric unit (BMU) for receiving the input bit and calculating the metric data,
- an Add-Compare-Select unit (ACSU) for forming selection data, and
- a survivor memory unit (SMU) for storing bit sequences, wherein the survivor memory further comprises:
  - a first memory matrix, which contains bit storage places in matrix form where the horizontally consecutive storage places form the first memory rows and the vertically consecutive storage places form the first memory columns,
  - a second memory matrix, which contains bit storage places in matrix form where the horizontally consecutive storage places form the second memory rows and the vertically consecutive storage places form the second memory columns,
  - an input for receiving selection data from the ACSU,
  - adding means for adding fixed-value bits to a column as a default and first column for forming the bit values of the second memory columns, in which each first column is a column among the second memory columns,
  - copying means for copying the contents of certain first memory rows row by row to the second memory rows while avoiding copying over the default column, where the received selection data affects the placement of the rows regarding which first memory row contents are copied to the second memory row; and
  - forming means for forming the initial bit value from the bit values of the second column, in which every second column is a column from the second memory columns.

27. An electronic device comprising
- receiving means for receiving the bit sequence, forming means for forming the selection data from the bit sequence, and
- a survivor memory unit (SMU) for storing bit sequences, wherein the survivor memory further comprises:
  - a first memory matrix, which contains bit storage places in matrix form where the horizontally consecutive storage places form the first memory rows and the vertically consecutive storage places form the first memory columns,
  - a second memory matrix, which contains bit storage places in matrix form where the horizontally consecutive storage places form the second memory rows and the vertically consecutive storage places form the second memory columns,
  - an input for receiving selection data from the forming equipment,
  - adding means for adding fixed-value bits to a column as a default and first column for forming the bit values of the second memory columns, in which each first column is a column among the second memory columns,
  - copying means for copying the contents of certain first memory rows row by row to the second memory rows while avoiding copying over the default column, where the received selection data affects the placement of the rows regarding which first memory row contents are copied to which second memory row, and
  - forming means for forming the initial bit value from the bit values of the second column, in which every second column is a column from the second memory columns.

28. A device according to claim 27, wherein the device is a mobile communications device.

29. A device according to claim 27, wherein the device is a computer.

* * * * *